United States Patent [19]

Lotfi et al.

[11] Patent Number: 5,717,342
[45] Date of Patent: Feb. 10, 1998

[54] OUTPUT BUFFER INCORPORATING SHARED INTERMEDIATE NODES

[75] Inventors: Younes J. Lotfi, Round Rock; John D. Porter, Austin, both of Tex.

[73] Assignee: Advanced Micro Devices, Inc., Sunnyvale, Calif.

[21] Appl. No.: 745,410

[22] Filed: Nov. 22, 1996

Related U.S. Application Data

[63] Continuation of Ser. No. 523,068, Sep. 1, 1995, abandoned.

[51] Int. Cl.$^6$ .............................................. H03K 19/0948
[52] U.S. Cl. ........................... 326/17; 326/58; 326/83
[58] Field of Search ........................ 326/26, 27, 56, 326/57, 58, 83, 17, 86

[56] References Cited

U.S. PATENT DOCUMENTS

| | | |
|---|---|---|
| 4,608,504 | 8/1986 | Yamamoto ................................. 326/83 |
| 5,066,873 | 11/1991 | Chan et al. ............................... 326/86 |
| 5,111,064 | 5/1992 | Ward . | |
| 5,221,865 | 6/1993 | Phillips et al. ............................ 326/16 |
| 5,225,720 | 7/1993 | Kondoh et al. ........................... 326/50 |
| 5,319,252 | 6/1994 | Pierce et al. . | |
| 5,479,123 | 12/1995 | Gist et al. ................................. 326/82 |
| 5,583,457 | 12/1996 | Horiguchi et al. ........................ 326/83 |
| 5,594,371 | 1/1997 | Douseki ................................... 326/83 |
| 5,604,454 | 2/1997 | Maguire et al. .......................... 326/86 |

FOREIGN PATENT DOCUMENTS

| | | |
|---|---|---|
| 0253087A2 | 1/1988 | European Pat. Off. . |
| 0436280A1 | 7/1991 | European Pat. Off. . |
| 5335927 | 12/1993 | Japan . |
| 7115360 | 5/1995 | Japan . |
| WO 92/02079 | 2/1992 | WIPO . |

OTHER PUBLICATIONS

*Noise Reduction Method for VLSI Logic Chips*, 700 IBM Technical Disclosure Bulletin, vol. 30, No. 3, p. 1275, (Aug., 1987), Armonk, New York, USA.

R. Senthinathan and J.L. Pierce, "Application Specific CMOS Output Driver Circuit Design Techniques to Reduce Simultaneous Switching Noise", IEEE Journal of Solid-State Circuits, vol. 28, No. 12, Dec. 1993, pp. 1383–1388.

*Primary Examiner*—Edward P. Westin
*Assistant Examiner*—Benjamin D. Driscoll
*Attorney, Agent, or Firm*—Skjerven, Morrill, MacPherson, Franklin & Friel, L.L.P.; Andrew C. Graham

[57] ABSTRACT

An output buffer is disclosed for an integrated circuit having a varying number of simultaneously switching outputs. As fewer outputs on the integrated circuit are simultaneously switching, the output conductance of certain logic gates within each of the output buffers on the integrated circuit is increased by sharing intermediate nodes between each of the output buffers. Consequently, the speed of the output buffer increases as fewer of the outputs simultaneously switch and internally generated noise is small. Conversely, as additional outputs simultaneously switch, the output conductance of certain logic gates within the output buffer is decreased, resulting in reduced speed of the output buffers and a corresponding reduction in internally generated noise.

26 Claims, 5 Drawing Sheets

OUTPUT BUFFER INCORPORATING SHARED INTERMEDIATE NODES

This application is a continuation of application Ser. No. 08/523,068, filed Sep. 1, 1995, abandoned.

BACKGROUND OF THE INVENTION

1. Field of the Invention

This invention relates to the design of integrated circuits, and more specifically relates to the design of digital output buffers.

2. Description of Related Art

Output buffers are a necessary building block for integrated circuits. As on-chip delays have improved over recent years, the performance of output buffers has become a greater and greater concern.

In designing digital integrated circuits which have many outputs, and particularly those having many of the outputs switching simultaneously, great care must be exercised to control the turn-on transient of the large driver transistors used to actually drive the voltage of an output terminal high or low. At times, controlling the turn-off transient is important as well. Due to the unavoidable inductance of integrated circuit packages, bonding wires, and on-chip power busses, a high current transient may cause undesirable voltage variations in the instantaneous power supply voltage which actually reaches the various circuit blocks of an integrated circuit. Because the driver transistors used in the output buffers are frequently among the largest transistors on-chip and may be a significant source of such unwanted current transients if not controlled, output buffers on such an integrated circuit are frequently designed with a controlled current transient, which is often optimized for conditions which assume that many, if not all, of the output buffers are switching at the same time. Such a constraint results in degraded output buffer performance, which may be measured in terms of greater propagation delay through the output buffer, and/or slower rise and fall times of the voltage waveform of the output terminal itself.

In many integrated circuits the performance of an output buffer (during a transition of its output) improves as the number of simultaneously switching outputs decreases. This arises simply because of less internally generated power supply noise. Unfortunately, the degraded performance of a controlled transient output buffer (as discussed above) substantially continues even when only one or a few outputs are simultaneously switching, which is a drawback of such an approach. While some synchronous design techniques must admittedly rely only on the worst case performance of the various circuits used, other design techniques are more asynchronous in character and may take advantage of valid outputs from an integrated circuit as soon as available. Such design techniques do not benefit fully from circuits whose output buffers remain degraded even as fewer outputs simultaneously switch.

SUMMARY OF THE INVENTION

It is an object of the present invention to provide a high performance digital output buffer having higher performance as fewer numbers of outputs simultaneously switch than when all output buffers simultaneously switch.

It is a further object of the present invention to provide a high performance digital output buffer having higher performance as fewer numbers of outputs simultaneously switch than would arise merely from a corresponding reduction in power supply noise alone.

These and other objects are accomplished by the current invention which, for one embodiment, includes an output buffer having certain intermediate nodes shared with like nodes within other output buffers. By sharing such intermediate nodes, the output conductance (or pullup or pulldown strength) of logic gates within the output buffer is increased as fewer outputs simultaneously switch, and further as additional output buffers are connected to share such intermediate nodes. For example, the drain of an N-channel MOS transistor (NMOS transistor) within an output buffer may be shared with the drain of the respective transistor within other output buffers when the respective gate terminals are coupled to a common signal and when the respective source terminals are coupled to the VSS power supply terminal. Likewise, the drain of a P-channel MOS transistor (PMOS transistor) within an output buffer may be shared with the drain of the respective transistor within other output buffers when the respective gate terminals are coupled to a common signal and when the respective source terminals are coupled to the VDD power supply terminal. Because the effective pullup or pulldown strength of logic gates within the output buffer is increased as fewer outputs simultaneously switch, the resulting transition rate of the output increases with a decreasing number of simultaneously switching outputs.

In one apparatus embodiment, the present invention provides an output buffer for a multiple output integrated circuit having a variable number of simultaneously switching outputs, the output buffer having a first logic circuit for generating a first driver control signal on an output thereof, said first logic circuit output having a controlled output conductance during a transition of the first driver control signal to an associated active state, wherein the controlled output conductance increases with a decreasing number of simultaneously switching outputs. The output buffer further includes a first driver circuit, responsive to the first driver control signal, for driving the buffer output voltage toward a first power supply voltage when the first driver control signal transitions to its respective active state. The resulting transition rate of the buffer output voltage, when driven toward the first power supply voltage, increases with decreasing number of simultaneously switching outputs.

In another embodiment of the current invention, an output buffer apparatus for a multiple output integrated circuit having a variable number of simultaneously switching outputs includes a first power supply terminal for receiving a first power supply voltage, a second power supply terminal for receiving a second power supply voltage, and a reference voltage terminal for receiving a reference voltage. A plurality of output buffers, each for driving a respective buffer output voltage upon a respective buffer output terminal, is included. Each output buffer includes a first MOS transistor having a drain/source terminal connected to the first power supply terminal, a gate terminal, and a source/drain terminal connected to the buffer output terminal. A second MOS transistor has a drain/source terminal connected to the gate terminal of the first MOS transistor, a gate terminal connected to a first control signal, and a source/drain terminal connected to a first intermediate node. A third MOS transistor has a drain/source terminal connected to the first intermediate node, a gate terminal connected to the reference voltage terminal, and a source/drain terminal connected to the second power supply terminal. The respective first intermediate nodes within each of the respective output buffers are interconnected.

In still another embodiment of the current invention, an output buffer apparatus for a multiple output integrated circuit having a variable number of simultaneously switching outputs includes a first power supply terminal for receiving a first power supply voltage, a second power supply terminal for receiving a second power supply voltage, a third power supply terminal for receiving the first power supply voltage, a fourth power supply terminal for receiving the second power supply voltage, and a reference terminal for receiving a reference voltage. A plurality of output buffers is included, each output buffer for driving a respective buffer output voltage upon a respective buffer output terminal. Each output buffer includes a first logic gate having first and second inputs and having an output, said first input responsive to a true output polarity control signal, said second input responsive to a buffer output enable control signal, said first logic gate being coupled to a first power supply terminal through a first controlled-current circuit, and coupled to a second power supply terminal, said first logic gate and said first controlled-current circuit defining a first intermediate node therebetween. A second logic gate is included, having an input coupled to the first logic gate output and having an output, said second logic gate being coupled to the first power supply terminal through a second controlled-current circuit, and coupled to the second power supply terminal, said second logic gate and said second controlled-current circuit defining a second intermediate node therebetween. A first driver circuit is included, having an input responsive to the second logic gate output, having an output coupled to a buffer output terminal, said first driver circuit being coupled to the third power supply terminal. A third logic gate has first and second inputs and has an output, said first input responsive to a complement output polarity control signal, said second input responsive to the buffer output enable control signal, said third logic gate being coupled to the first power supply terminal through a third controlled-current circuit, and coupled to the second power supply terminal, said third logic gate and said third controlled-current circuit defining a third intermediate node therebetween. A fourth logic gate has an input coupled to the third logic gate output and has an output, said fourth logic gate being coupled to the first power supply terminal through a fourth controlled-current circuit, and coupled to the second power supply terminal, said fourth logic gate and said fourth controlled-current circuit defining a fourth intermediate node therebetween. A second driver circuit is included, having an input responsive to the fourth logic gate output, having an output coupled to the buffer output terminal, said second driver circuit being coupled to the fourth power supply terminal. The respective second intermediate nodes within each of the plurality of output buffers are interconnected, and the respective fourth intermediate nodes within each of the plurality of output buffers are interconnected.

DETAILED DESCRIPTION OF THE PREFERRED EMBODIMENTS

Figure 1:
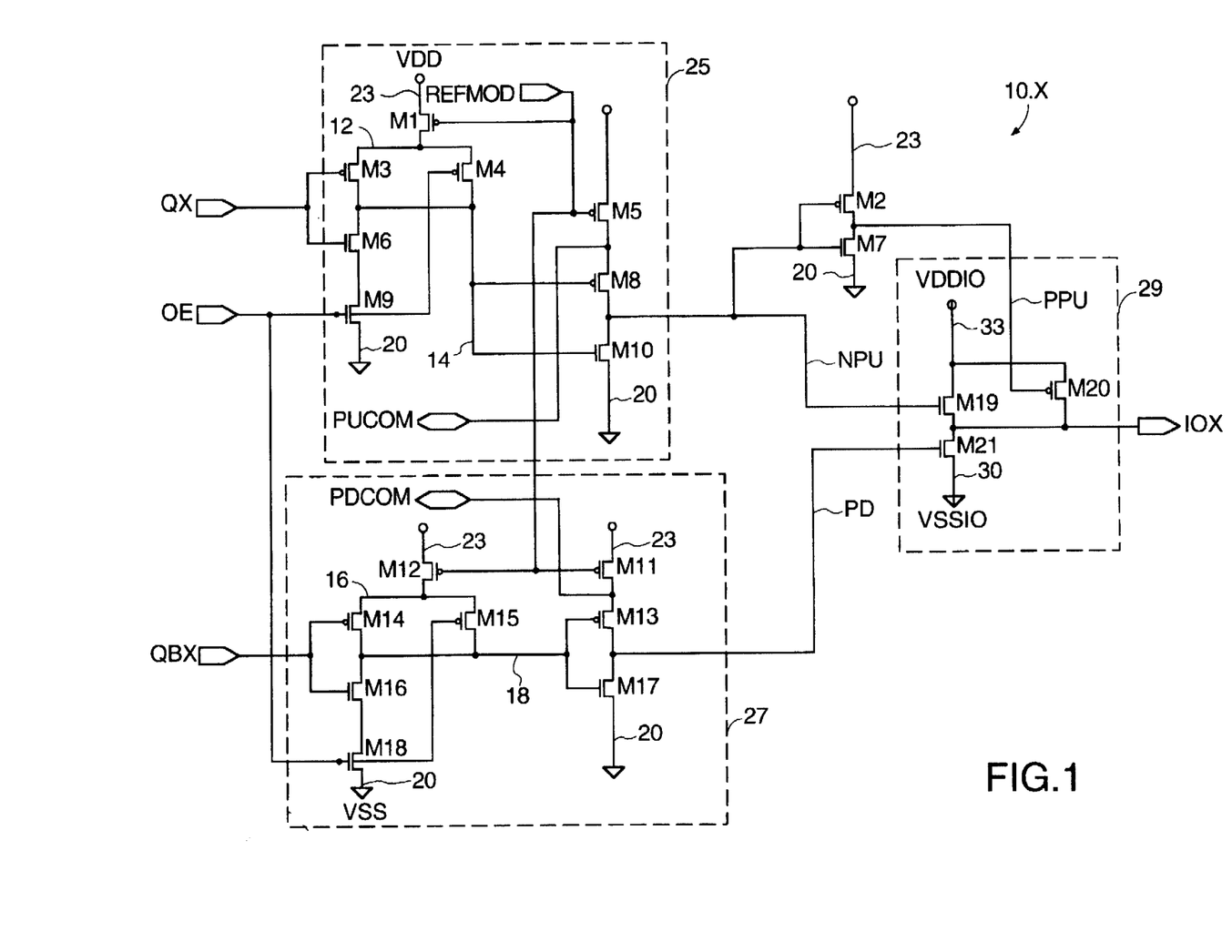
FIG. 1 is a schematic diagram of an output buffer in accordance with the current invention.

Referring to FIG. 1, an output buffer 10.X receives a true and complement logic signal (QX and QBX, respectively) which is buffered to drive an output IOX, suitable for driving a heavily loaded output, and particularly useful as an off-chip pin driver. An output enable signal OE provides for a three-state output (a high-impedance state as well as logic "0" and "1").

From an overall point of view, a buffer section 25 receives the true logic signal QX and generates an associated signal NPU for driving the gate terminal of the NMOS pull-up transistor of the output driver section 29, which is transistor M19. The signal NPU is inverted to form a signal PPU for driving the gate terminal of a PMOS pull-up transistor M20 of the output driver section 29. When disabled by output enable signal OE, buffer section 25 drives the signal NPU to VSS potential (conveyed on terminal 20) to turn off transistor M19 rather than allowing the signal NPU to follow the true logic signal QX.

A similar buffer section 27 receives the complement logic signal QBX and generates an associated signal PD for driving the gate terminal of the NMOS pull-down transistor M21 of the output driver section 29. When disabled by output enable signal OE, buffer section 27 drives the signal PD to VSS potential to turn off transistor M21 rather than allowing the signal PD to follow the complement logic signal QBX.

Referring again to the buffer section 25, transistors M3 and M6 form an inverter which generates (when enabled by the output enable signal OE) a signal on node 14 which is the complement of the true logic signal QX. When the output enable signal OE is low (and hence the buffer section 25 is disabled) transistor M9 is turned off to eliminate current flow through the M3/M6 inverter, and transistor M4 is turned on to drive the level of node 14 high. The inverter formed by transistors M8 and M10 responds to such a high level on node 14 by driving the NPU signal low, thus turning off transistor M19 of output driver 29.

Transistors M1 and M5 are used to limit the current drawn from the VDD power supply during an output transition. A reference voltage REFMOD is coupled to the gate terminals of transistors M1 and M5, which are biased by reference voltage REFMOD to operate substantially as constant current sources. Consequently, intermediate node 12 and intermediate node PUCOM function as controlled-conductance "pseudo-VDD" nodes to the remainder of buffer section 25. Alternatively, if the intermediate node between transistors M5 and M8 (node PUCOM), and the intermediate node 12 between transistors M1 and M3/M4 were both connected directly to the VDD power supply conveyed on terminal 23, the buffer section 25 would provide the same logic function at node NPU as described above, but without the current limiting afforded by the reference voltage REFMOD.

The voltage level of REFMOD is preferably designed to compensate for changes in the level of the VDD power supply in order to provide for a constant current level through transistors M1 and M5. Thus, when VDD is at a high voltage, and where the speed through the output buffer (as well as through the other circuits residing on the same integrated circuit) is consequently faster, the level of REFMOD adjusts to a higher voltage to maintain a current constant through transistors M1 and M5. This tends to stabilize the rate at which node NPU is driven high, which otherwise would increase with an increase in the VDD power supply level. Conversely, when VDD is at a low voltage, and where the speed through the output buffer (as well as through the other circuits residing on the same integrated circuit) is likely to be slower, the level of REFMOD adjusts to a lower voltage to maintain the current through transistors M1 and M5. This again tends to stabilize the rate at which node NPU is driven high.

Alternatively, the voltage level of REFMOD may also be designed to overcompensate for changes in the level of the VDD power supply. Thus, when VDD is at a high voltage, and where the speed through the output buffer (as well as through the other circuits residing on the same integrated circuit) is consequently faster, the level of REFMOD adjusts to lower the current through transistors M1 and M5. This reduces the transient current of the output buffer 10.X by decreasing the output conductance (output pull-up strength) of the M8/M10 inverter. This decreases the rate at which node NPU is driven high, which otherwise would increase with an increase in the VDD power supply level. Conversely, when VDD is at a low voltage, and where the speed through the output buffer (as well as through the other circuits residing on the same integrated circuit) is likely to be slower, the level of REFMOD adjusts to increase the current through transistors M1 and M5. This increases the pull-up strength of the M8/M10 inverter, and consequently increases the speed of the output buffer 10.X by increasing the rate at which node NPU is driven high, which otherwise would decrease as a result of a decrease in the VDD power supply level.

Referring again to the buffer section 27, transistors M14 and M16 form an inverter which generates (when enabled by the output enable signal OE) a signal on node 18 which is opposite in polarity to the complement logic signal QBX. When the output enable signal OE is low (and hence the buffer section 27 is disabled) transistor M18 is turned off to eliminate current flow through the M14/M16 inverter, and transistor M15 is turned on to drive the level of node 18 high. The inverter formed by transistors M13 and M17 responds to such a high level on node 18 by driving the PD signal low, thus turning off transistor M21 of output driver 29.

As discussed above for buffer section 25, the intermediate node between transistors M11 and M13 (node PDCOM), and the intermediate node 16 between transistors M12 and M14/M15 function as controlled-conductance "pseudo VDD" nodes. Transistors M12 and M11 are used to limit the current drawn from the VDD power supply during an output transition. The reference voltage REFMOD is coupled to the gate terminals of transistors M12 and M11, which then operate substantially as constant current sources. The voltage level of REFMOD, as discussed above, is preferably designed to compensate for changes in the level of the VDD power supply, and modulates the rise and fall time of signal PD similarly to that described above for signal NPU.

An inverter formed by transistors M2 and M7 generates the signal PPU which, as mentioned above, drives the gate terminal of PMOS transistor M20. Both NMOS transistor M19 and PMOS transistor M20 are used to drive the output IOX high because the NMOS transistor M19 affords a more constant current during the voltage transition but cannot drive the voltage of output IOX all the way to the VDD level, while the PMOS transistor M20 is able to drive all the way to the VDD level and provides for a "rail-to-rail" output (an output low voltage driven all the way to the VSS power supply level, and an output high voltage driven all the way to the VDD power supply level).

Figure 2:
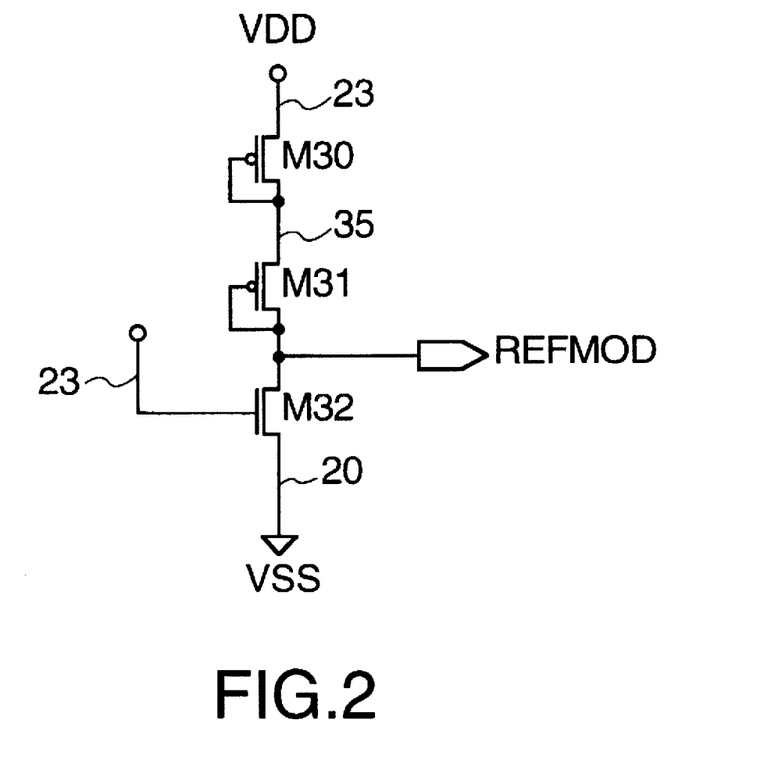
FIG. 2 is a schematic diagram of a reference voltage circuit useful to the output buffer of FIG. 1.

FIG. 2 is a schematic diagram of a circuit embodiment for generating the reference voltage REFMOD. P-channel transistors M30 and M31 and N-channel transistor M32 are series-connected between the VDD power supply conveyed on terminal 23 and the VSS power supply conveyed on terminal 20. The gate and drain terminals of transistor M30 are connected together at node 35, and the gate and drain terminals of transistor M31 are connected together at the output node REFMOD. Both transistors M30 and M31 are thus connected in a "diode" configuration. Transistor M32 is preferably a narrow, long NMOS transistor which establishes a small bias current therethrough because its gate terminal is biased at VDD potential. This small bias current flows through transistors M30 and M31, which are substantially larger than transistor M32, and which current establishes, across each transistor M30 and M31, a voltage substantially equal to the P-channel threshold voltage. Consequently, the reference voltage REFMOD generally tracks the VDD power supply voltage and is shifted below the VDD level by approximately twice the P-channel threshold voltage. In other words, REFMOD=VDD−2·$V_{TP}$.

Figure 3:
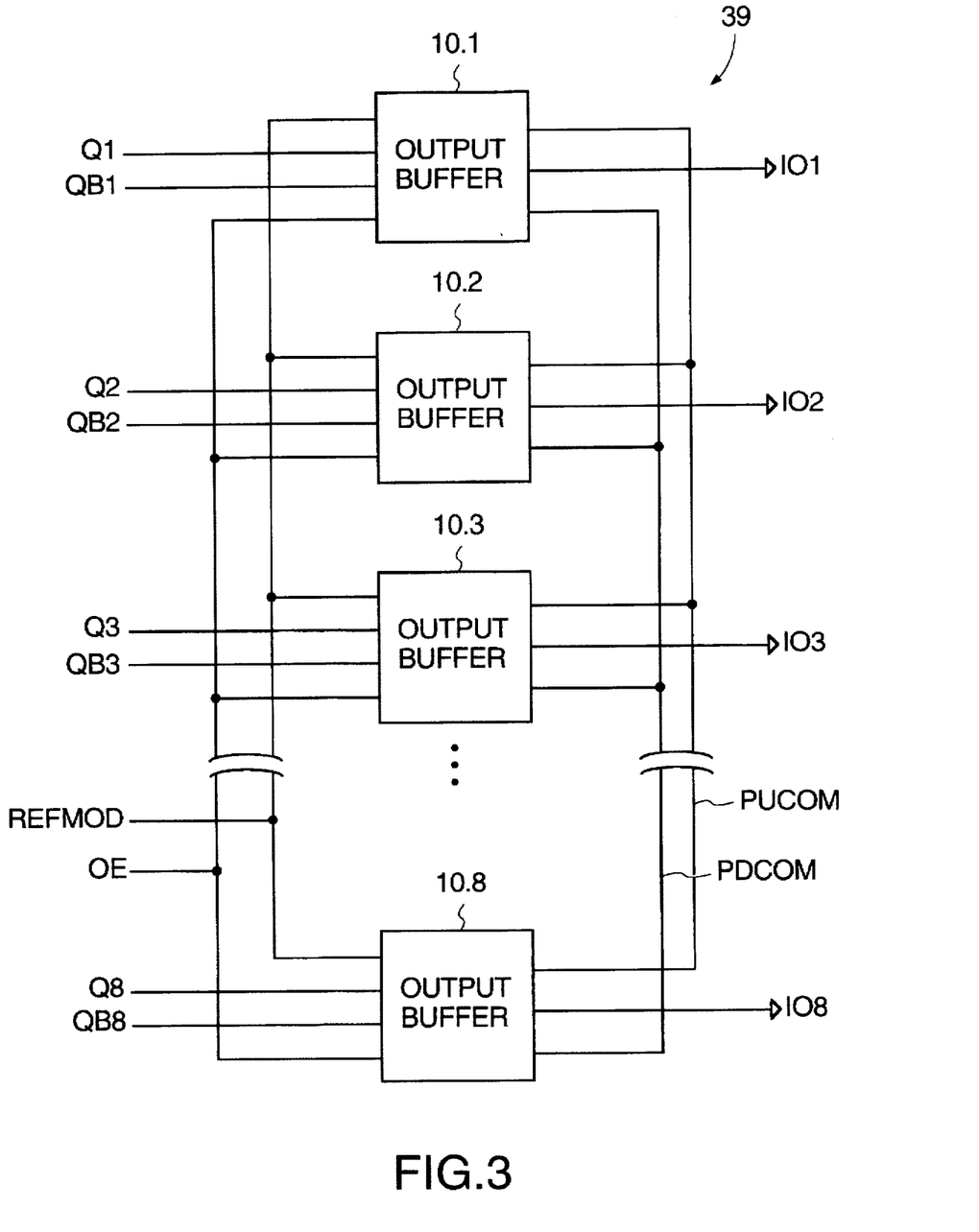
FIG. 3 is a schematic diagram of a group of eight output buffers, each buffer as shown in FIG. 1, interconnected in accordance with the current invention.

Referring now to FIG. 3, a block of output buffers 39 is shown which represents an output buffer for each of eight individual outputs. Output buffer 10.1 receives a true and complement logic signal (Q1 and QB1, respectively) and generates a corresponding output IO1 when enabled by output enable signal OE, and which output buffer 10.1 provides for a high impedance state on output IO1 when disabled by output enable signal OE. Output buffers 10.2, 10.3, . . . 10.8 receive respective logic signals Q2/QB2, Q3/QB3, . . . Q8/QB8, and generate respective outputs IO2, IO3, . . . IO8.

The respective intermediate nodes PUCOM from each of the eight output buffers 10.1, 10.2, . . . 10.8 are interconnected, as shown. Likewise, the respective intermediate nodes PDCOM from each of the eight output buffers 10.1, 10.2, . . . 10.8 are also interconnected.

To understand the operation and advantages of this output buffer arrangement, consider the case when only one output switches high with the other seven outputs remaining stable (unchanged in value). For example, assume all eight output buffers are enabled by output enable signal OE, and the true logic signal Q1 is driven high (and its complement logic signal QB1 correspondingly driven low). Output buffer 10.1 consequently then drives the output IO1 high. Assume that signals Q2/QB2 through Q8/QB8 remain stable such that the respective outputs IO2 through IO8 remain unchanged. Referring again back to FIG. 1, the signal NPU follows the polarity of the true logic signal QX (which for output buffer 10.1 is, of course, Q1) and consequently is driven high by the series combination of transistors M5 and M8. The current through transistor M5 is limited, however, by the biasing of reference voltage REFMOD coupled to the gate terminal thereof, as was discussed above. However, the source, gate and drain terminals of the transistor M5 within each of the eight output buffers are each connected to the VDD power supply, the reference voltage REFMOD, and the PUCOM node, respectively. Thus, the respective transistors M5 from each of the eight output buffers are essentially tied together in parallel by the interconnection of the PUCOM node, and afford a much higher current flow when connected together (in fact, eight times the current for this example) than for a single transistor M5. This increased current affords an increased output pull-up strength for the M8/M10 inverter.

In a different example where two outputs simultaneously switch and the other six remain unchanged, the combined-current through the eight transistors M5 (the transistor M5 within each of the eight output buffers 10.1, 10.2, . . . 10.8) now must be used to drive two NPU signals high (one NPU signal within each of the two high-going output buffers), and so the effective increase in current reduces to four times the value through a single transistor M5. Consequently, the rise time of the two high-going NPU signals is less than the single output transition case above, and which results in a slower rise time for the output IOX.

In a final example, if all eight output buffers simultaneously switch high, the combined current through the eight transistors M5 (the transistor M5 within each of the eight output buffers 10.1, 10.2, ... 10.8) now must be used to drive all eight NPU signals high (one NPU signal within each of the eight high-going output buffers), and so the effective current is no different than for a single transistor M5. Consequently, the rise time of the eight high-going NPU signals is no different than if the PUCOM nodes were not shared, and which results in a rise time for the eight outputs IOX which is controlled by the transistors within each individual output buffer.

Figure 4:
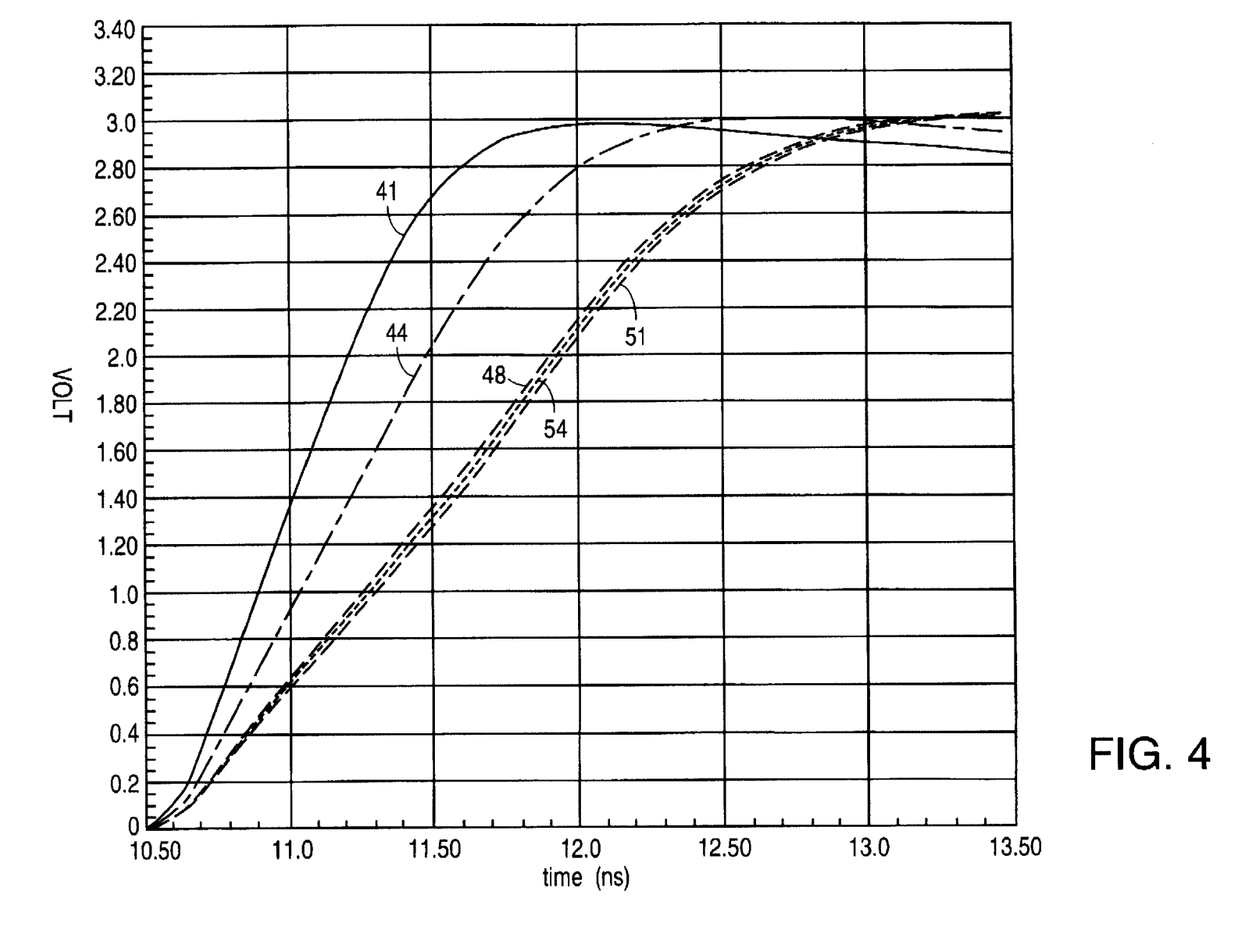
FIG. 4 is a waveform diagram showing an output waveform of the output buffer group of FIG. 3 for several different numbers of simultaneously switching outputs.

FIG. 4 is a waveform plot showing the rise time of the output IOX for various numbers of simultaneously switching outputs. For the case as just described where intermediate nodes PUCOM and PDCOM are shared between buffers, waveform 41 corresponds to an output IOX when only one output is switching. Waveform 44, which exhibits a slower rise time than waveform 41, corresponds to each of four simultaneously switching outputs IOX. Waveform 48, which exhibits an even slower rise time than waveform 44, corresponds to each of eight simultaneously switching outputs IOX. As can be clearly seen, the rise time of the output IOX increases as fewer outputs simultaneously switch (when sharing the intermediate nodes between buffers).

In contrast, waveform 51 corresponds to an output IOX when only one output is switching, in an output buffer block which does not share node PUCOM between each of the output buffers within the block. Waveform 54 represents the rise time when four outputs IOX are switching, again assuming PUCOM is not shared. No speed improvement is achieved, as each output buffer independently determines the delay and rise time of its various signals.

Referring again to FIG. 1 and FIG. 3, a similar analysis may be applied to the intermediate node PDCOM which is interconnected (and thus shared) between each of the eight output buffers and which modulates the rise time of the signal PD coupled to the gate of the N-channel pull-down transistor M21. Consequently, the fall time of output IOX of output buffer 10.X is also modulated to take advantage of additional speed as fewer and fewer outputs simultaneously switch.

Figure 5:
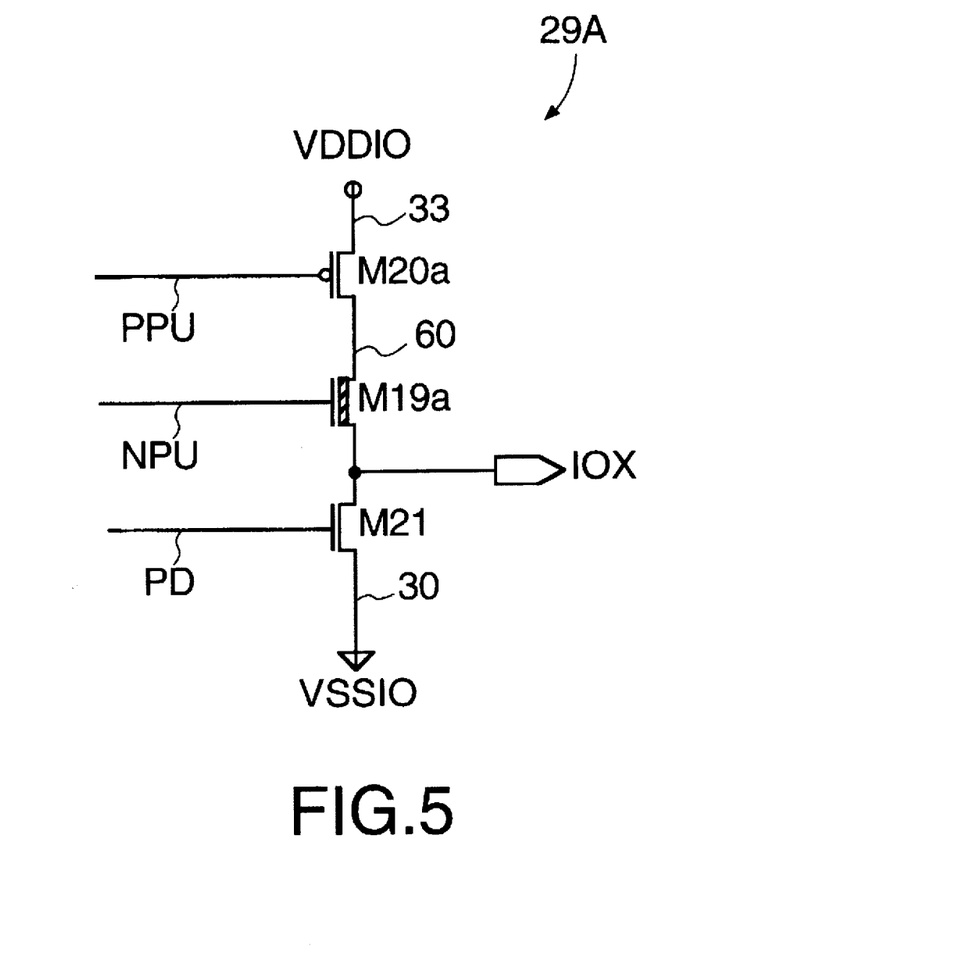
FIG. 5 is a schematic diagram of an alternate embodiment of an output driver circuit of the output buffer of FIG. 1.

FIG. 5 is a schematic diagram of output driver 29a, which is an additional embodiment useful with the output buffer circuit as otherwise indicated in FIG. 1. The output buffer output IOX is driven high through two series-connected transistors M20a and M19a. Transistor M20a is a PMOS transistor gated by the PPU signal and coupling the I/O power supply voltage VDDIO conveyed on terminal 33 to an intermediate node 60. Separate power supply terminals are used to convey the VDDIO and VSSIO power supply levels to the output driver transistors to help isolate transient noise arising from switching large currents within the output driver, especially transistors M19a and M21a. Even though terminal 33 is likely connected to the same power supply by an end user as terminal 23, the separation of circuit traces on a printed wiring board, within the integrated circuit package, and on the integrated circuit die affords significant noise isolation. Transistor M19a is a depletion-mode NMOS transistor gated by the NPU signal and which couples the intermediate node 60 to the output IOX. As in output driver 29 shown in FIG. 1, enhancement-mode NMOS transistor M21 is gated by the PD signal and couples the output IOX to the I/O power supply voltage VSSIO conveyed on terminal 30.

The risetime of output IOX of output driver 29a is controlled by the PMOS transistor M20a, while the output IOX may still be driven fully to the VDD level because the NMOS transistor M19a is a depletion-mode device (an N-channel transistor having a negative threshold voltage). A high output impedance of output driver 29a, when disabled, is nonetheless maintained by ensuring that transistors M20a and M21 are adequately turned off, and does not depend upon choosing a specific depletion threshold voltage.

A transistor may be conceptualized as having a control terminal which controls the flow of current between a first current handling terminal and a second current handling terminal. An appropriate condition on the control terminal causes a current to flow from/to the first current handling terminal and to/from the second current handling terminal. In a bipolar NPN transistor, the first current handling terminal may be deemed the collector, the control terminal deemed the base, and the second current handling terminal deemed the emitter. A sufficient base current into the base causes a collector-to-emitter current to flow. In a bipolar PNP transistor, the first current handling terminal may be deemed the emitter, the control terminal deemed the base, and the second current handling terminal deemed the collector. A sufficient base current exiting the base causes an emitter-to-collector current to flow.

An MOS transistor may likewise be conceptualized as having a control terminal which controls the flow of current between a first current handling terminal and a second current handling terminal. Although MOS transistors are frequently discussed as having a drain, a gate, and a source, in most such devices the drain is interchangeable with the source. This is because the layout and semiconductor processing of the transistor is symmetrical (which is typically not the case for bipolar transistors). For an N-channel MOS transistor, the current handling terminal normally residing at the higher voltage is customarily called the drain. The current handling terminal normally residing at the lower voltage is customarily called the source. A sufficient voltage on the gate (relative to the source voltage) causes a current to therefore flow from the drain to the source. The source voltage referred to in N-channel MOS device equations merely refers to whichever drain or source terminal has the lower voltage at any given point in time. For example, the "source" of the N-channel device of a bi-directional CMOS transfer gate depends on which side of the transfer gate is at the lower voltage. To reflect this symmetry of most N-channel MOS transistors, the control terminal may be deemed the gate, the first current handling terminal may be termed the "drain/source", and the second current handling terminal may be termed the "source/drain". Such a description is equally valid for a P-channel MOS transistor, since the polarity between drain and source voltages, and the direction of current flow between drain and source, is not implied by such terminology. Alternatively, one current-handling terminal may arbitrarily deemed the "drain" and the other deemed the "source", with an implicit understanding that the two are not distinct, but interchangeable.

While the invention has been largely described with respect to the embodiments set forth above, the invention is not necessarily limited to these embodiments. For example, a logic gate other than an inverter may be used to generate the signal NPU within buffer section 25. Also, the signal conveyed on node 14 may be generated by a variety of embodiments, so long as it follows an input signal when enabled (or gated) and assumes an inactive state when disabled. As an additional example, both the intermediate nodes PUCOM and PDCOM may be both interconnected and shared between multiple output buffers. By so doing, the increase in performance, when fewer output buffers are simultaneously switching, is even greater. As a further example, a controlled conductance output of inverter M8/M10 when driving a low-going transition on node NPU may be achieved by including a suitably-biased NMOS device in series with transistor M10 and sharing the newly-created intermediate node between other output buffers. Such a controlled conductance on a low-going signal NPU affords increased performance of turn-off transients as fewer outputs simultaneously switch, similar to that described above. Moreover, while the embodiments have been described in the context of an output buffer for an integrated circuit, it should be appreciated that such a circuit is useful for any circuit block needing to drive heavily-loaded outputs. Accordingly, other embodiments, variations, and improvements not described herein are not necessarily excluded from the scope of the invention, which is defined by the following appended claims.

What is claimed is:

1. An output buffer for a multiple output integrated circuit having a variable number of simultaneously switching outputs, said output buffer comprising:

a first power supply terminal for receiving a first power supply voltage;

a buffer output terminal for conveying a buffer output voltage thereon;

a first logic circuit for generating a first driver control signal on an output thereof, said first logic circuit output having a controlled output conductance during a transition of the first driver control signal conveyed thereon to an associated active state, wherein the controlled output conductance increases with a decreasing number of simultaneously switching outputs; and a first driver circuit, responsive to the first driver control signal, for driving the buffer output voltage toward the first power supply voltage when the first driver control signal transitions to its respective active state;

whereby a resulting transition rate of the buffer output voltage, when driven toward the first power supply voltage, increases with decreasing number of simultaneously switching outputs.

2. An output buffer as in claim 1 further comprising:

a second power supply terminal for receiving a second power supply voltage;

a second logic circuit for generating a second driver control signal on an output thereof, said second logic circuit output having a controlled output conductance during a transition of the second driver control signal conveyed thereon to an associated active state, wherein the controlled output conductance increases with a decreasing number of simultaneously switching outputs; and a second driver circuit, responsive to the second driver control signal, for driving the buffer output voltage toward the second power supply voltage when the second driver control signal transitions to its respective active state;

whereby a resulting transition rate of the buffer output voltage, when driven toward the second power supply voltage, increases with decreasing number of simultaneously switching outputs.

3. An output buffer as in claim 1 wherein the first logic circuit comprises:

a first inverter having an input terminal for receiving a first output control signal, having an output terminal for conveying the first driver control signal thereon; and a first controlled-current circuit coupled between the first inverter and a power supply terminal, for controlling the output conductance of the first inverter, said first inverter and said first controlled-current circuit defining a first intermediate node therebetween.

4. An output buffer as in claim 2 wherein the second logic circuit comprises:

a second inverter having an input terminal for receiving a second output control signal, having an output terminal for conveying the second driver control signal thereon; and a second controlled-current circuit coupled between the second inverter and a power supply terminal for controlling the output conductance of the second inverter, said second inverter and said second controlled-current circuit defining a second intermediate node therebetween.

5. An output buffer as in claim 3 wherein the first controlled-current circuit comprises:

a reference voltage terminal for receiving a reference voltage;

a first PMOS transistor having a P-channel threshold voltage, having a drain/source terminal connected to the first intermediate node, a gate terminal connected to the reference voltage terminal, and a source/drain terminal connected to the first power supply terminal; and wherein the reference voltage received on the reference terminal resides at a voltage approximately equal to the first power supply voltage received on the first power supply terminal less an amount related to the P-channel threshold voltage; and wherein the first intermediate node is interconnected with respective first intermediate nodes within other output buffers.

6. An output buffer as in claim 4 wherein the second controlled-current circuit comprises:

a second PMOS transistor having a P-channel threshold voltage, having a drain/source terminal connected to the second intermediate node, a gate terminal connected to the reference voltage terminal, and a source/drain terminal connected to the first power supply terminal; and wherein the second intermediate node is interconnected with respective second intermediate nodes within other output buffers.

7. An output buffer as in claim 1 wherein the first driver circuit comprises an NMOS transistor and a PMOS transistor in a parallel combination.

8. An output buffer as in claim 1 wherein the first driver circuit comprises an NMOS transistor and a PMOS transistor in a series combination.

9. An output buffer apparatus for a multiple output integrated circuit having a variable number of simultaneously switching outputs, comprising:

a first power supply terminal for receiving a first power supply voltage;

a second power supply terminal for receiving a second power supply voltage;

a reference voltage terminal for receiving a reference voltage;

a plurality of output buffers, each output buffer for driving a respective buffer output voltage upon a respective buffer output terminal, each output buffer comprising a buffer output terminal for conveying the buffer output voltage thereon;

a first MOS transistor having a drain/source terminal connected to the first power supply terminal, a gate terminal, and a source/drain terminal connected to the buffer output terminal;

a second MOS transistor having a drain/source terminal connected to the gate terminal of the first MOS transistor, a gate terminal connected to a first control signal, and a source/drain terminal connected to a first intermediate node;

a third MOS transistor having a drain/source terminal connected to the first intermediate node, a gate terminal connected to the reference voltage terminal, and a source/drain terminal connected to the second power supply terminal; and wherein the respective first intermediate nodes within each of the respective output buffers are interconnected.

10. An output buffer apparatus as in claim 9 wherein the second and third MOS transistors each comprises a PMOS transistor.

11. An output buffer apparatus as in claim 10 wherein the first power supply voltage conveyed on the first power supply terminal is nominally equal to the second power supply voltage conveyed on the second power supply terminal.

12. An output buffer apparatus as in claim 10 wherein the first power supply voltage conveyed on the first power supply terminal is unequal to the second power supply voltage conveyed on the second power supply terminal.

13. An output buffer apparatus as in claim 12 wherein the first power supply voltage conveyed on the first power supply terminal is higher than the second power supply voltage conveyed on the second power supply terminal.

14. An output buffer apparatus as in claim 9 wherein the second and third MOS transistors each comprises an NMOS transistor.

15. An output buffer apparatus as in claim 14 wherein the first power supply voltage conveyed on the first power supply terminal is nominally equal to the second power supply voltage conveyed on the second power supply terminal.

16. An output buffer apparatus as in claim 14 wherein the first power supply voltage conveyed on the first power supply terminal is unequal to the second power supply voltage conveyed on the second power supply terminal.

17. An output buffer apparatus as in claim 9 further comprising:

a third power supply terminal for receiving a third power supply voltage;

a fourth power supply terminal for receiving a fourth power supply voltage;

wherein each output buffer further comprises a fourth MOS transistor having a drain/source terminal connected to the buffer output terminal, a gate terminal, and a source/drain terminal connected to the third power supply terminal;

a fifth MOS transistor having a drain/source terminal connected to the gate terminal of the fourth MOS transistor; a gate terminal connected to a second control signal, and a source/drain terminal connected to a second intermediate node;

a sixth MOS transistor having a drain/source terminal connected to the second intermediate node, a gate terminal connected to the reference voltage terminal, and a source/drain terminal connected to the fourth power supply terminal; and wherein the respective second intermediate nodes within each of the respective output buffers are interconnected.

18. An output buffer apparatus as in claim 17 wherein the respective first intermediate nodes and the respective second intermediate nodes within each of the respective output buffers are all interconnected.

19. An output buffer apparatus as in claim 17 wherein the second, third, fifth, and sixth MOS transistors comprise PMOS transistors and wherein the first and fourth MOS transistors comprises NMOS transistors.

20. An output buffer apparatus as in claim 19 wherein the first, third, and fourth power supply voltages are each higher than the second power supply voltage.

21. An output buffer apparatus for a multiple output integrated circuit having a variable number of simultaneously switching outputs, comprising:

a first power supply terminal for receiving a first power supply voltage;

a second power supply terminal for receiving a second power supply voltage;

a third power supply terminal for receiving the first power supply voltage;

a fourth power supply terminal for receiving the second power supply voltage;

a reference terminal for receiving a reference voltage;

a plurality of output buffers, each output buffer for driving a respective buffer output voltage upon a respective buffer output terminal, each output buffer comprising a buffer output terminal for conveying the buffer output voltage thereon;

a first logic gate having first and second inputs and having an output, said first input responsive to a true output polarity control signal, said second input responsive to a buffer output enable control signal, said first logic gate being coupled to the first power supply terminal through a first controlled-current circuit, and coupled to the second power supply terminal, said first logic gate and said first controlled-current circuit defining a first intermediate node therebetween;

a second logic gate having an input coupled to the first logic gate output and having an output, said second logic gate being coupled to the first power supply terminal through a second controlled-current circuit, and coupled to the second power supply terminal, said second logic gate and said second controlled-current circuit defining a second intermediate node therebetween;

a first driver circuit, having an input responsive to the second logic gate output, having an output coupled to the buffer output terminal, said first driver circuit being coupled to the third power supply terminal;

a third logic gate having first and second inputs and having an output, said first input responsive to a complement output polarity control signal, said second input responsive to the buffer output enable control signal, said third logic gate being coupled to the first power supply terminal through a third controlled-current circuit, and coupled to the second power supply terminal, said third logic gate and said third controlled-current circuit defining a third intermediate node therebetween;

a fourth logic gate having an input coupled to the third logic gate output and having an output, said fourth logic gate being coupled to the first power supply terminal through a fourth controlled-current circuit, and coupled to the second power supply terminal, said fourth logic gate and said fourth controlled-current circuit defining a fourth intermediate node therebetween;

a second driver circuit, having an input responsive to the fourth logic gate output, having an output coupled to the buffer output terminal, said second driver circuit being coupled to the fourth power supply terminal;

wherein the respective second intermediate nodes within each of the plurality of output buffers are interconnected; and wherein the respective fourth intermediate nodes within each of the plurality of output buffers are interconnected.

22. An output buffer apparatus as in claim 21 wherein the first driver circuit within each of the plurality of output buffers comprises:

an NMOS transistor having a drain/source terminal coupled to the third power supply terminal, a gate terminal coupled to the first driver circuit input, and a source/drain terminal coupled to the first driver circuit output;

an inverter having an input coupled to the first driver circuit input, and having an output;

a PMOS transistor having a drain terminal coupled to the first driver circuit output, a gate terminal coupled to the inverter output, and a source/drain terminal coupled to the third power supply terminal.

23. An output buffer apparatus as in claim 21 wherein the first driver circuit within each of the plurality of output buffers comprises:

an NMOS transistor having a drain/source terminal, a gate terminal coupled to the first driver circuit input, and a source/drain terminal coupled to the first driver circuit output;

an inverter having an input coupled to the first driver circuit input, and having an output;

a PMOS transistor having a drain terminal coupled to the drain/source terminal of the NMOS transistor, a gate terminal coupled to the inverter output, and a source/drain terminal coupled to the third power supply terminal.

24. An output buffer apparatus as in claim 21 wherein the second driver circuit within each of the plurality of output buffers comprises an NMOS transistor having a drain/source terminal connected to the second driver circuit output, a gate terminal coupled to the second driver circuit input, and a source/drain terminal coupled to the fourth power supply terminal.

25. An output buffer apparatus as in claim 21 wherein the first, second, third, and fourth controlled-current circuits each comprises a PMOS transistor having a P-channel threshold voltage, having a drain/source terminal respectively connected to the respective first, second, third, and fourth intermediate node, a gate terminal connected to the reference terminal, and a source/drain terminal connected to the first power supply terminal.

26. An output buffer apparatus as in claim 25 wherein the reference voltage conveyed on the reference terminal resides at a voltage approximately equal to the first power supply voltage received on the first power supply terminal less an amount related to the P-channel threshold voltage.

* * * * *